(12) United States Patent
Takano

(10) Patent No.: US 12,107,030 B2
(45) Date of Patent: Oct. 1, 2024

(54) SEMICONDUCTOR DEVICE, SEMICONDUCTOR MODULE, VEHICLE, AND MANUFACTURING METHOD OF SEMICONDUCTOR DEVICE

(71) Applicant: FUJI ELECTRIC CO., LTD., Kanagawa (JP)

(72) Inventor: Sho Takano, Hino (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 125 days.

(21) Appl. No.: 17/581,970

(22) Filed: Jan. 23, 2022

(65) Prior Publication Data

US 2022/0301957 A1   Sep. 22, 2022

(30) Foreign Application Priority Data

Mar. 18, 2021   (JP) .................................. 2021-045102

(51) Int. Cl.
| | | |
|---|---|---|
| *H01L 23/373* | (2006.01) | |
| *B60L 50/00* | (2019.01) | |
| *H01L 21/48* | (2006.01) | |
| *H01L 23/13* | (2006.01) | |
| *H01L 23/24* | (2006.01) | |
| *H01L 23/538* | (2006.01) | |
| *H01L 25/07* | (2006.01) | |

(52) U.S. Cl.
CPC ...... *H01L 23/3735* (2013.01); *H01L 21/4807* (2013.01); *H01L 23/13* (2013.01); *H01L 23/24* (2013.01); *H01L 23/5385* (2013.01); *H01L 25/072* (2013.01); *B60L 50/00* (2019.02)

(58) Field of Classification Search
CPC ..... H01L 23/3735; H01L 23/13; H01L 23/24; H01L 23/5385; H01L 25/072
See application file for complete search history.

(56) References Cited

U.S. PATENT DOCUMENTS

| | | | |
|---|---|---|---|
| 2007/0145540 A1 | 6/2007 | Mochida | |
| 2014/0117508 A1* | 5/2014 | Nishi | H01L 23/3735 |
| | | | 257/622 |
| 2016/0295701 A1 | 10/2016 | Fukuda | |
| 2016/0329260 A1* | 11/2016 | Dinkel | H01L 23/5389 |
| 2020/0176354 A1* | 6/2020 | Matsuzawa | H01L 23/49575 |

FOREIGN PATENT DOCUMENTS

| | | |
|---|---|---|
| JP | 2006344770 A | 12/2006 |
| JP | 2007173680 A | 7/2007 |
| JP | 2016195206 A | 11/2016 |
| JP | 2016195224 A | 11/2016 |
| JP | 2017069275 A | 4/2017 |

OTHER PUBLICATIONS

Office Action issued for counterpart Japanese Application No. 2021-045102, issued by the Japanese Patent Office on Jun. 29, 2021 (drafted on Jun. 22, 2021).

* cited by examiner

*Primary Examiner* — Yara B Green
*Assistant Examiner* — Fakeha Sehar

(57) ABSTRACT

Provided is a semiconductor device including: a laminated substrate in which a circuit layer, an insulating layer, and a metal layer are sequentially laminated. A slit is formed in the circuit layer. A recess recessed from one surface side facing the insulating layer toward the other surface side is formed in the metal layer. The recess of the metal layer has a relaxation portion at least partially overlapping the slit of the circuit layer in a planar view.

18 Claims, 22 Drawing Sheets

SEMICONDUCTOR DEVICE, SEMICONDUCTOR MODULE, VEHICLE, AND MANUFACTURING METHOD OF SEMICONDUCTOR DEVICE

The contents of the following Japanese patent application(s) are incorporated herein by reference:
NO. 2021-045102 filed in JP on Mar. 18, 2021

BACKGROUND

1. Technical Field

The present invention relates to a semiconductor device, a semiconductor module, a vehicle, and a manufacturing method of the semiconductor device.

2. Related Art

Conventionally, a semiconductor module having a laminated substrate on which a plurality of semiconductor elements such as a power semiconductor chip is mounted is known (see, for example, Patent Documents 1 and 2).

PRIOR ART DOCUMENT

Patent Document

Patent Document 1: Japanese Patent Application Publication No. 2016-195206
Patent Document 2: Japanese Patent Application Publication No. 2016-195224

DESCRIPTION OF EXEMPLARY EMBODIMENTS

Hereinafter, the present invention will be described through embodiments of the invention, but the following embodiments do not limit the invention according to the claims. In addition, not all combinations of features described in the embodiments are essential to the solution of the invention.

Figure 1:
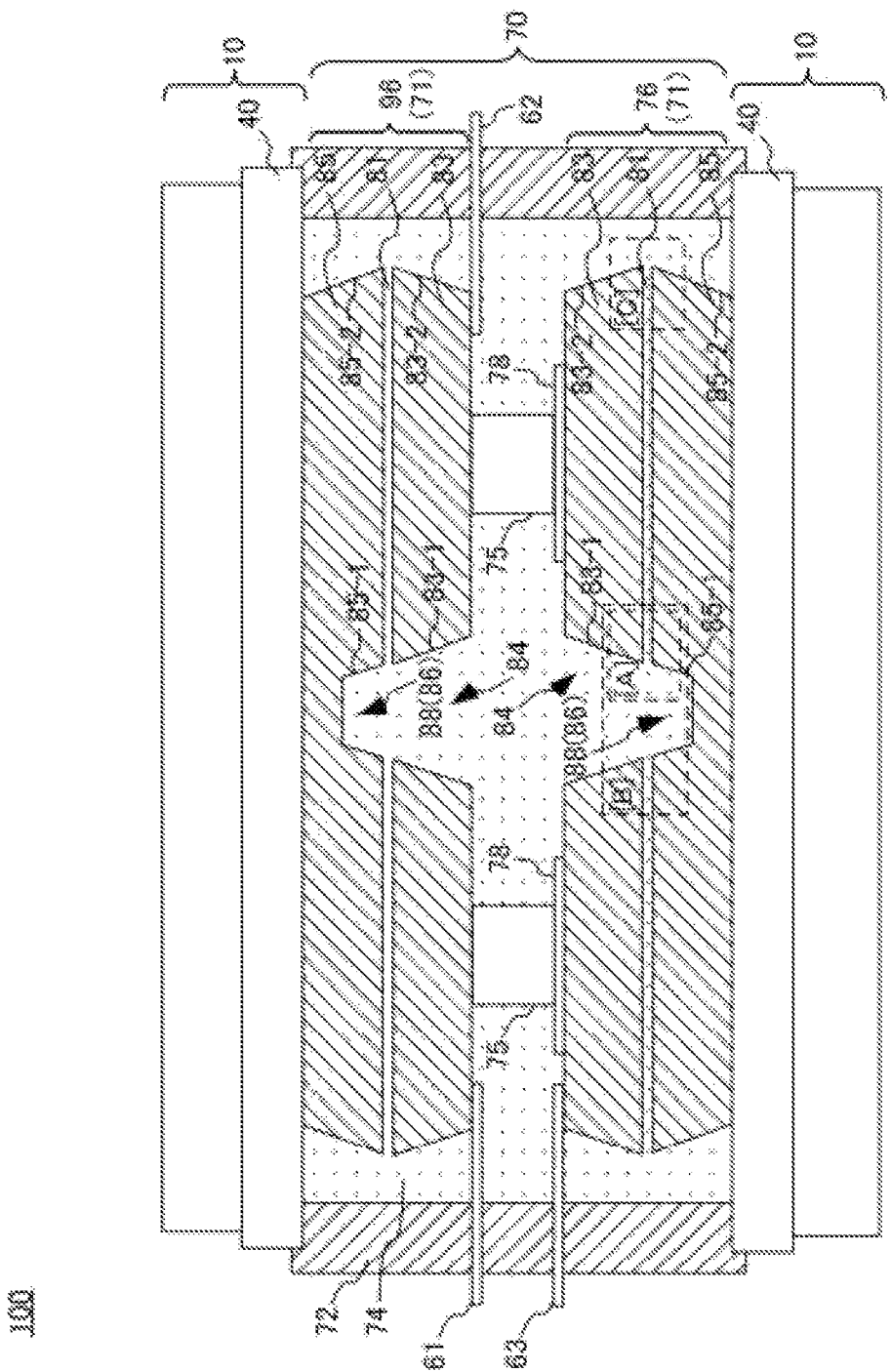
FIG. 1 is a schematic sectional view illustrating an example of a semiconductor device 100 according to one embodiment of the present invention.

FIG. 1 is a schematic sectional view illustrating an example of a semiconductor device 100 according to one embodiment of the present invention. In FIG. 1, each of a region A, a region B, and a region C in the semiconductor device 100 is indicated by a broken line.

The semiconductor device 100 includes a semiconductor module 70 and a cooling device 10. As an example, the semiconductor device 100 according to the present embodiment cools both surfaces of the semiconductor module 70 by two cooling devices 10. Alternatively, the semiconductor device 100 may cool one surface of the semiconductor module 70 by one cooling device 10.

The semiconductor module 70 according to the present embodiment is placed in the cooling device 10. It is noted that, in the description of the present embodiment, a planar view means a case where the semiconductor device 100, the semiconductor module 70, and the like are viewed from the principal surface side of the semiconductor device 100. In FIG. 1, a planar view means a case where the semiconductor device 100 and the like are viewed from above toward the paper surface.

The semiconductor module 70 includes a laminated substrate 71. The semiconductor module 70 according to the present embodiment further includes a semiconductor chip 78. In addition, in the present embodiment, the laminated substrate 71 includes a circuit board 76 and a wiring board 96 facing the circuit board 76. The semiconductor module 70 according to the present embodiment includes a set of the circuit board 76 and the wiring board 96 in each of U phase, V phase, and W phase units.

The semiconductor module 70 according to the present embodiment further includes a sealing portion 74 that at least partially seals the laminated substrate 71, a housing portion 72 that surrounds the sealing portion 74, and a conductive post 75. Note that the present example includes the housing portion 72, but may not include the housing portion. When the housing portion 72 is not provided, the sealing portion 74 may be molded by transfer molding or the like. The function of the housing portion 72 described later may be substituted by the sealing portion 74.

The semiconductor module 70 according to the present embodiment includes a U-phase unit, a V-phase unit, and a W-phase unit as a power semiconductor device, and each unit includes the circuit board 76 on which a plurality of semiconductor chips 78 are mounted and the wiring board 96.

The semiconductor module 70 according to the present embodiment further includes a set of an input terminal 61 and an input terminal 62, which are a P terminal and an N terminal, and an output terminal 63. For example, the semiconductor module 70 has the set in each of the U-phase, V-phase, and W-phase units, and in this case, the semiconductor device 100 functions as a device constituting a three-phase AC inverter. Note that the output terminal 63 in the semiconductor module 70 may be electrically connected to a load, for example, a motor of a car or the like.

The semiconductor chip 78 is a vertical semiconductor element and has an upper surface electrode and a lower surface electrode. As an example, the semiconductor chip 78 includes elements such as an insulated gate bipolar transistor (IGBT), a MOS field effect transistor (MOSFET), and a freewheeling diode (FWD) formed on a semiconductor substrate made of silicon or the like. The semiconductor chip 78 may be a reverse conducting IGBT (RC-IGBT) in which an IGBT and an FWD are formed on one semiconductor substrate. In the RC-IGBT, the IGBT and the FWD may be connected in anti-parallel.

The upper surface electrode of the semiconductor chip 78 may be an emitter, a source, or an anode electrode, and the lower surface electrode may be a collector, a drain, or a cathode electrode. The semiconductor substrate in the semiconductor chip 78 may be silicon carbide (SiC) or gallium nitride (GaN).

The semiconductor chip 78 including a switching element such as an IGBT or a MOSFET has a control electrode. The semiconductor device 100 may have a control terminal connected to a control electrode of the semiconductor chip 78. The switching element can be controlled by an external control circuit via a control terminal.

In the laminated substrate 71, a circuit layer 83, an insulating layer 81, and a metal layer 85 are sequentially laminated. In the present embodiment, each of the circuit board 76 and the wiring board 96 includes the circuit layer 83, the insulating layer 81, and the metal layer 85.

The circuit board 76 and the wiring board 96 each are fixed to the cooling device 10 on the side of the metal layer 85. The wiring board 96 is provided to face the circuit board 76 and is electrically and thermally connected to the circuit board 76. In the present embodiment, the wiring board 96 is electrically and thermally connected to the circuit board 76 via the plurality of conductive posts 75 and the plurality of semiconductor chips 78.

The circuit layer 83 has a circuit pattern, that is, one or more slits 84 are formed in the circuit layer 83. In addition, in the present embodiment, one or a plurality of semiconductor chips 78 are mounted on the circuit layer 83 of the circuit board 76. The lower surface electrode of the semiconductor chip 78 is connected to the upper surface of the circuit layer 83 of the circuit board 76. The upper surface electrode of the semiconductor chip 78 is connected to the circuit layer 83 of the wiring board 96 via the conductive post 75. Note that the circuit layer 83 of each substrate may be electrically connected to another conductive member by a wire or the like.

One or more recesses 86 are formed in the metal layer 85. The recess 86 is recessed from one surface side of the metal layer 85 facing the insulating layer 81 toward the other surface side of the metal layer 85. In a planar view, the recess 86 of the metal layer 85 has a relaxation portion 88 that at least partially overlaps the slit 84 of the circuit layer 83. The circuit layer 83 and the metal layer 85 may be a plate material containing a conductive material such as copper or a copper alloy.

The insulating layer 81 may be, for example, a plate material containing a resin material such as an epoxy resin. The resin material has lower thermal conductivity than ceramics. Therefore, in a case where the insulating layer 81 is formed of a resin material, it is necessary to reduce the thickness of the insulating layer 81. As a specific example, the thickness of the insulating layer 81 formed of a resin material is 0.1 mm or less. Note that, in a case where the insulating layer 81 is a plate material containing a resin material, the circuit layer 83 and the metal layer 85 may be fixed to each surface of the insulating layer 81, for example, by curing the resin material in a state where the uncured resin material is filled between the circuit layer 83 and the metal layer 85.

Note that the insulating layer 81 may be a plate material containing ceramics instead of the plate material containing a resin material, and more specifically, may be formed using ceramic material such as alumina ($Al_2O_3$), aluminum nitride (AlN), or silicon nitride ($Si_3N_4$). As a specific example, the thickness of the insulating layer 81, which is a plate material containing ceramics, is about 0.32 mm. Note that, in a case where the insulating layer 81 is a plate material containing ceramics, the circuit layer 83 and the metal layer 85 are fixed to each surface of the insulating layer 81 by, for example, brazing, soldering, or the like.

The relaxation portion 88 is made of a resin material such as an epoxy resin, for example. The relaxation portion 88 relaxes the electric field strength of at least a portion of the insulating layer 81, which is adjacent to the slit 84, during driving of the semiconductor chip 78.

In the present embodiment, the relaxation portion 88 extends along the slit 84 in a planar view. As a result, the relaxation portion 88 can reduce the electric field strength of at least a portion of the insulating layer 81, which is extending along the slit 84.

Note that a part of the relaxation portion 88 may not extend along the slit 84 in a planar view. For example, a part of the relaxation portion 88 may be intermittent with respect to the slit 84 continuously extending in the circuit layer 83 in a planar view, that is, may extend so as to be intermittent along the extending direction of the slit 84.

The sealing portion 74 is a dielectric member containing a resin such as silicone gel or epoxy resin, for example. The housing portion 72 is a frame body formed of a dielectric material such as a thermosetting resin or an ultraviolet curable resin. The housing portion 72 of the present embodiment is provided, on the cooling device 10, to surround a region where the circuit board 76 and the like are disposed. In other words, the housing portion 72 of the present embodiment has an internal space capable of accommodating the semiconductor chip 78, the circuit board 76, and other circuit elements.

The housing portion 72 may be provided integrally with the input terminals 61 and 62 and the output terminal 63 described above. In addition, the housing portion 72 may be bonded onto the cooling device 10. Note that, as an example, the above-described sealing portion 74 is formed by filling the internal space of the housing portion 72 with the above-described resin and curing the resin.

The cooling device 10 includes a base plate 40 adjacent to the semiconductor module 70, and is thermally bonded to the metal layer 85 of the laminated substrate 71 in the semiconductor module 70. In the double-sided cooling type semiconductor device 100 according to the present embodiment, each cooling device 10 is bonded to the metal layer 85 of each of the circuit board 76 and the wiring board 96. The cooling device 10 cools the heat transferred from the semiconductor chip 78 through the laminated substrate 71 while the semiconductor device 100 is in an energized state (ON state), that is, while the semiconductor chip 78 is being driven.

In the semiconductor device 100 according to the present embodiment, as illustrated in FIG. 1, the relaxation portion 88 is integrally formed with the insulating layer 81. More specifically, the relaxation portion 88 is integrally formed with the insulating layer 81 by a resin material. More specifically, the relaxation portion 88 is integrally formed with the sealing portion 74 and the insulating layer 81 by a resin material. Note that, in a case where either the insulating layer 81 or the sealing portion 74 is formed of a resin material, the relaxation portion 88 may be formed of the same resin material as that of the either the insulating layer 81 or the sealing portion 74 or may be formed of a resin material different from the both.

Note that the relaxation portion 88 may not be integrally formed with either the insulating layer 81 or the sealing portion 74. The relaxation portion 88, the insulating layer 81, and the sealing portion 74 may be individually formed.

As a specific example, the insulating layer 81 may be a plate material formed of ceramic material, and in this case, the relaxation portion 88 may be integrally formed with the sealing portion 74 by a resin material. In this case, for example, the recess 86 of the metal layer 85 extends to an outer end portion 85-2 in the outer peripheral portion of the metal layer 85 in a planar view, and the relaxation portion 88 is provided in the recess 86. As a result, for example, after the laminated substrate 71 including the metal layer 85 in which the recess 86 is formed is formed, the laminated substrate 71 and the semiconductor chip 78 are sealed with an uncured resin material, whereby the uncured resin material can be filled into the recess 86 from the outer end portion 85-2 of the metal layer 85.

As another specific example, the insulating layer 81 and the relaxation portion 88 may be a plate material integrally formed of ceramic material. In this case, for example, a protrusion aligned so as to be fitted into the recess 86 of the metal layer 85 is formed in the plate material as a portion constituting the relaxation portion 88. As the strength of insulation, air is weaker than ceramics, and thus, if a cavity remains in the recess 86, it becomes a weak point in terms of insulation. On the other hand, by fitting the protrusion constituting the relaxation portion 88 of the plate material integrally formed of ceramic material into the recess 86 of the metal layer 85, it is possible to avoid a cavity from remaining in the recess 86 and becoming a weak point in terms of insulation. Note that, as in the present embodiment, also in a case where the relaxation portion 88 is formed of a resin material, the same effect is obtained.

Figure 2:
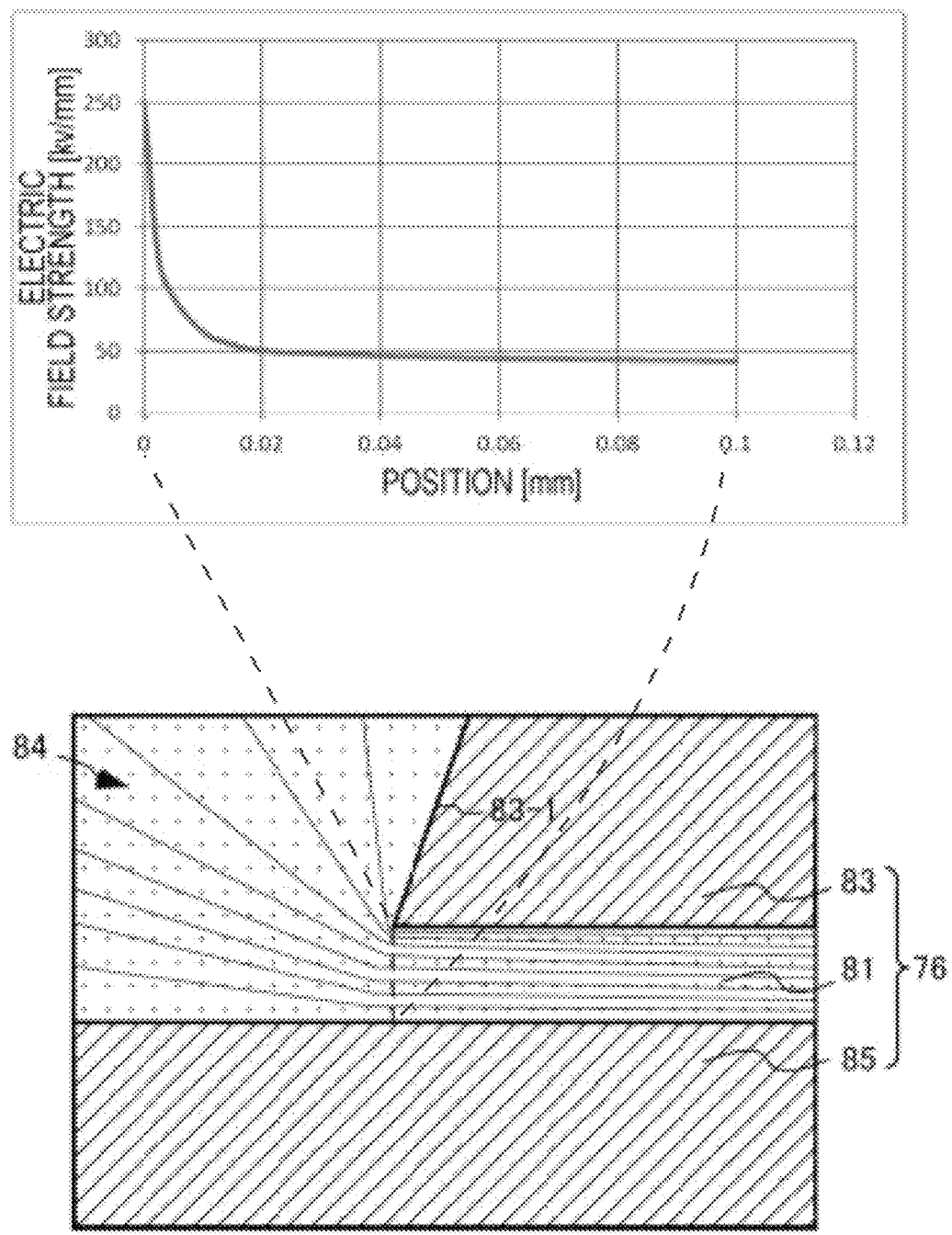
FIG. 2 is an explanatory diagram of a comparative example regarding a region [A] indicated by a broken line in FIG. 1.

FIG. 2 is an explanatory diagram of a comparative example regarding a region [A] indicated by a broken line in FIG. 1. In the comparative example, simply for the purpose of simplifying the description, a reference number corresponding to a reference number of the configuration of the semiconductor device 100 is used for a configuration corresponding to the configuration of the semiconductor device 100 according to the present embodiment illustrated in FIG. 1. Note that the same applies to the following drawings, and redundant description will be omitted.

In the partially enlarged view of the circuit board 76 illustrated on the left side of FIG. 2, equipotential lines are indicated by thin lines. In addition, on the right side of FIG. 2, a graph illustrating a relationship between a position [mm] on the shortest path from the corner located closest to the insulating layer 81 side to the metal layer 85 in an inner end portion 83-1 of the circuit layer 83 adjacent to the slit 84 of the circuit layer 83 of the circuit board 76 and the electric field strength [kv/mm] during driving of the semiconductor chip 78 is illustrated. In the position [mm] which is the horizontal axis of the graph, the corner of the circuit layer 83 is set to 0 [mm], and the surface of the metal layer 85 on the insulating layer 81 side is set to 0.1 [mm]. Note that the same applies to FIG. 3 described below, and redundant description will be omitted.

As illustrated in FIG. 2, during driving of the semiconductor chip 78, an electric field is generated in the insulating layer 81 interposed between the circuit layer 83 and the metal layer 85 due to a potential difference between the circuit layer 83 and the metal layer 85. The plurality of equipotential lines indicating the electric field strength are substantially at equal intervals in the region sandwiched between the circuit layer 83 and the metal layer 85 in the insulating layer 81, that is, there is almost no bias in the electric field strength.

However, in the comparative example of FIG. 2, the electric field strength distribution spreads in a direction away from the insulating layer 81 in the slits 84 located between the circuit patterns of the circuit layer 83, and this causes a bias in the electric field strength between the circuit layer 83 and the metal layer 85 near the slits 84.

On the left side of FIG. 2, as the interval between the equipotential lines is narrower, that is, as the equipotential lines are denser, the electric field strength is higher as illustrated in the graph on the right side of FIG. 2. As illustrated in FIG. 2, in the insulating layer 81 adjacent to the corner located closest to the insulating layer 81 side in the inner end portion 83-1 of the circuit layer 83 adjacent to the slit 84 of the circuit layer 83 (position 0 [mm]), equipotential lines become the densest, and the electric field strength in the insulating layer 81 becomes maximum (electric field strength 250 [kv/mm]). In addition, in the insulating layer 81, the electric field strength at the position 0 [mm] on the circuit layer 83 side is higher than the electric field strength at the position 0.1 [mm] on the metal layer 85 side by about 200 [kv/mm].

Note that, in the insulating layer 81, the electric field strength is higher in the portion on the inner end portion 83-1 side of the circuit layer 83 adjacent to the slit 84 of the circuit layer 83 than in the portion on the outer end portion 83-2 side in the outer peripheral portion of the circuit layer 83. This is because the area of the back surface electrode formed in the circuit layer 83 and the like is larger in the portion on the inner end portion 83-1 side. Therefore, the dielectric breakdown is most likely to occur in the portion on the inner end portion 83-1 side in the insulating layer 81, particularly in the vicinity of the above-described corner.

Figure 3:
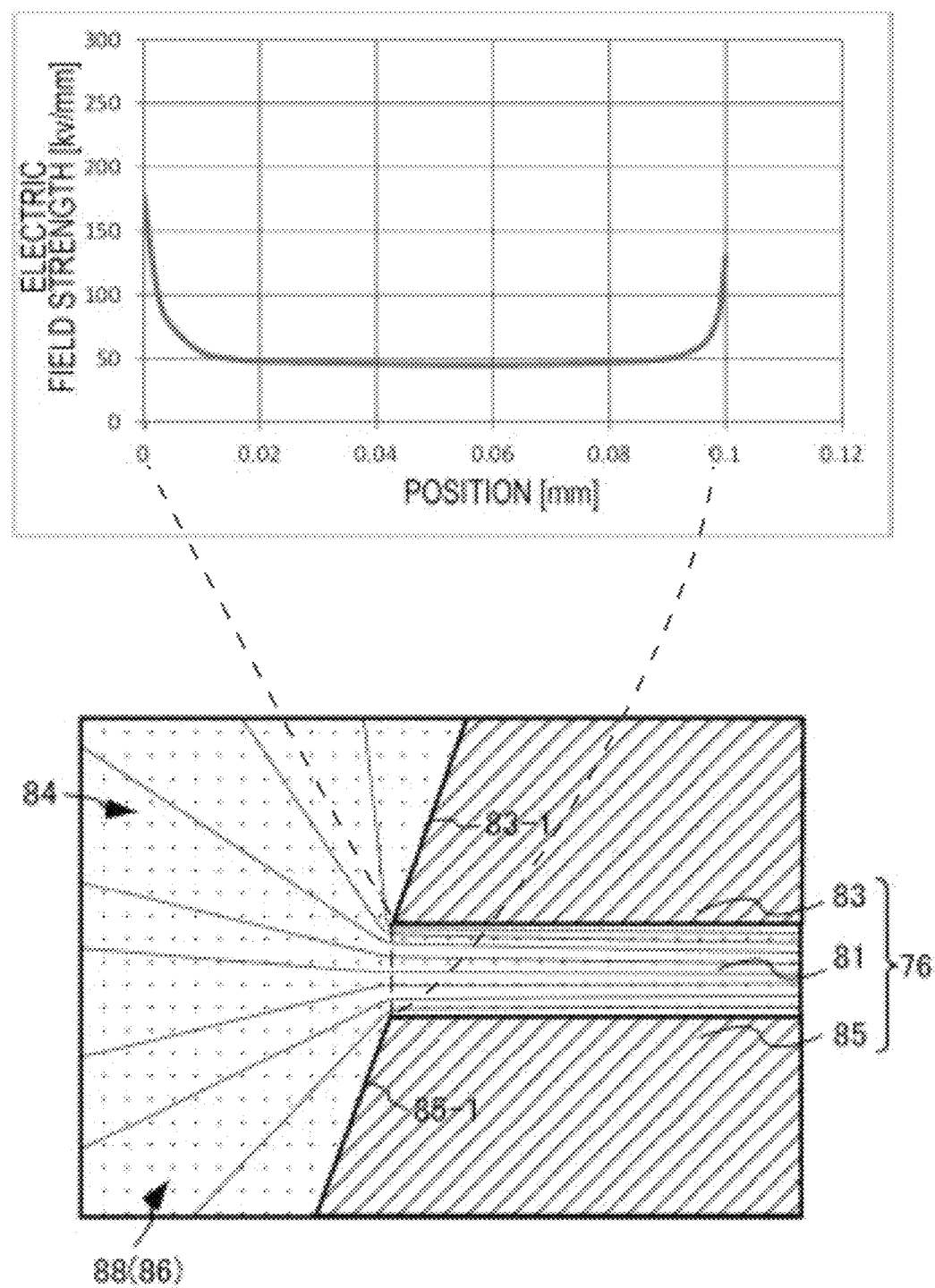
FIG. 3 is an explanatory diagram of an example regarding the region [A] indicated by the broken line in FIG. 1.

FIG. 3 is an explanatory diagram of an example regarding the region [A] indicated by a broken line in FIG. 1. According to the semiconductor module 70 of the present embodiment illustrated in FIG. 1, the recess 86 recessed from the one surface side facing the insulating layer 81 toward the other surface side is formed in the metal layer 85 of the laminated substrate 71. According to the semiconductor module 70 of the present embodiment, further, the recess 86 at least partially overlaps the slit 84 of the circuit layer 83 in a planar view, and the recess 86 is provided with the relaxation portion 88 that reduces the electric field strength of at least a portion of the insulating layer 81, which is adjacent to the slit 84.

In the example of FIG. 3, the electric field strength distribution spreads in a direction away from the insulating layer 81 not only in the slit 84 of the circuit layer 83 but also in the relaxation portion 88, whereby the bias of the electric field strength generated in the comparative example of FIG. 2 is reduced.

As illustrated in FIG. 3, in the insulating layer 81 adjacent to the corner located closest to the insulating layer 81 side in the inner end portion 83-1 of the circuit layer 83 adjacent to the slit 84 of the circuit layer 83 (position 0 [mm]), equipotential lines become densest, and the electric field strength in the insulating layer 81 becomes maximum. However, the electric field strength is about 180 [kv/mm], which is lower than the maximum electric field strength of 250 [kv/mm] in the comparative example of FIG. 2.

In addition, in the insulating layer 81, the electric field strength at the position 0 [mm] on the circuit layer 83 side is higher than the electric field strength at the position 0.1 [mm] on the metal layer 85 side by about 50 [kv/mm]. The electric field strength difference is smaller by about 150 [kv/mm] than that of the comparative example of FIG. 2. That is, it is understood that the bias of the electric field strength generated in the comparative example of FIG. 2 is reduced. This is because, in the example of FIG. 3, the maximum electric field strength in the insulating layer 81 is reduced as compared with the comparative example of FIG. 2, and the equipotential lines on an inner end portion 85-1 side of the metal layer 85 adjacent to the relaxation portion 88 are denser than those in the comparative example of FIG. 2, and the electric field strength in the portion on the inner end portion 85-1 side in the insulating layer 81 is increased.

The effects brought about by the relaxation portion 88 of the circuit board 76 have been described above with reference to FIG. 2 and FIG. 3. The relaxation portion 88 of the wiring board 96 having a laminated structure corresponding to the circuit board 76 also brings about the same effect as the above effect, and thus redundant description is omitted.

Note that, as described above, in a case where the insulating layer 81 is formed of a resin material, since the resin material has lower thermal conductivity than ceramics, the thickness of the insulating layer 81 needs to be reduced to about ⅓ or less as compared with the case where the insulating layer 81 is formed of ceramics. By reducing the thickness of the insulating layer 81, the electric field strength in the insulating layer 81 is further increased, so that the effect brought about by the relaxation portion 88 is further remarkable.

Figure 4A:
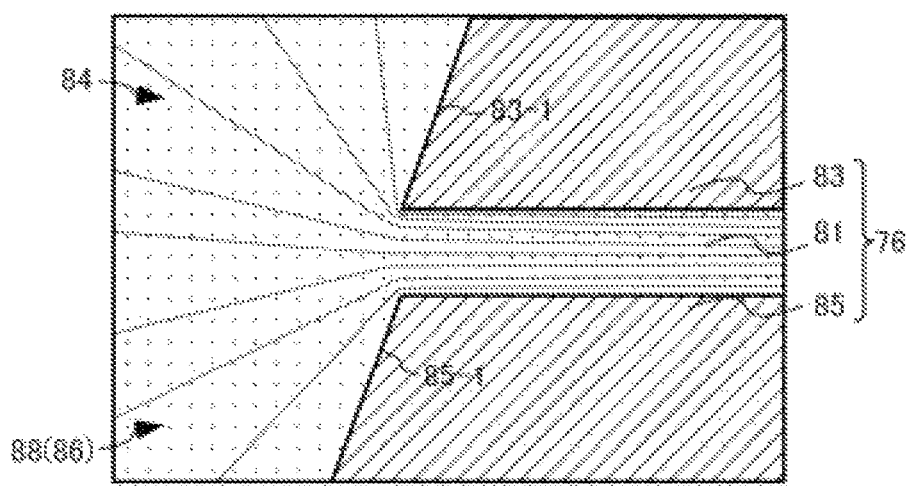
FIG. 4A is an explanatory diagram of an example regarding the region [A] indicated by the broken line in FIG. 1.
Figure 4B:
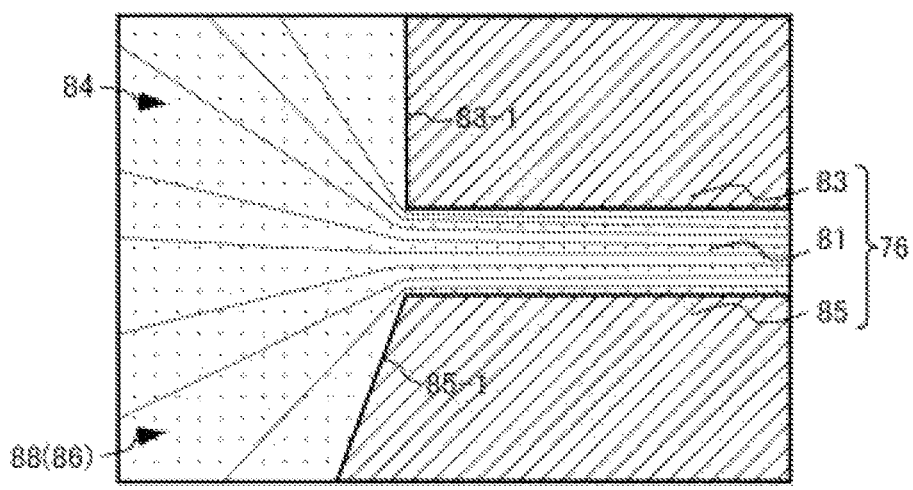
FIG. 4B is an explanatory diagram of a modification regarding the region [A] indicated by the broken line in FIG. 1.
Figure 4C:
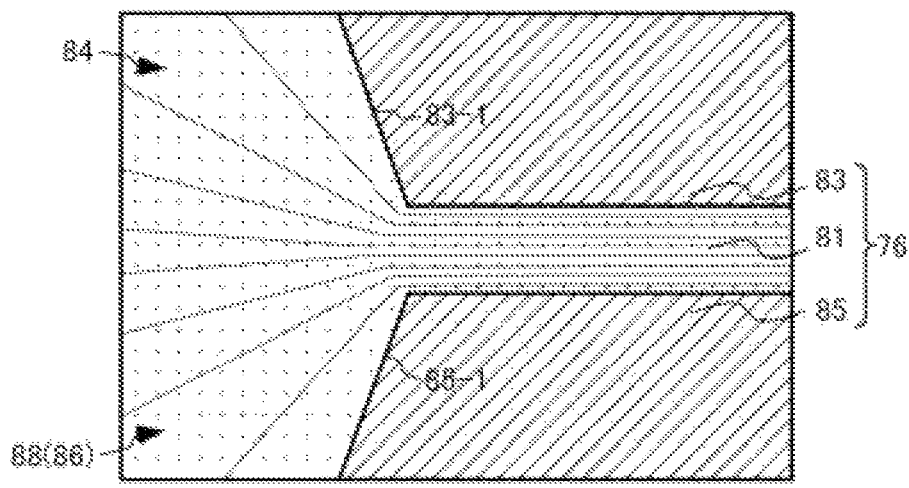
FIG. 4C is an explanatory diagram of a modification regarding the region [A] indicated by the broken line in FIG. 1.

FIG. 4A, FIG. 4B, and FIG. 4C are explanatory diagrams of an example and modifications regarding the region [A] indicated by a broken line in FIG. 1. FIG. 4A illustrates a configuration in the embodiment of FIG. 1, and FIG. 4B and FIG. 4C illustrate the modifications of the configuration in the embodiment of FIG. 1.

In any example, the inner end portion 85-1 of the metal layer 85 is formed at an obtuse angle. On the other hand, in the example illustrated in FIG. 4A, the inner end portion 83-1 of the circuit layer 83 is formed at an acute angle. In addition, in the modification illustrated in FIG. 4B, the inner end portion 83-1 of the circuit layer 83 is formed at a right angle. In addition, in the modification illustrated in FIG. 4C, the inner end portion 83-1 of the circuit layer 83 is formed at an obtuse angle.

In the cross section of the laminated substrate 71 in a laminating direction, the shape of the inner end portion 85-1 of the metal layer 85 adjacent to the relaxation portion 88 and the shape of the inner end portion 83-1 of the circuit layer 83 adjacent to the slit 84 of the circuit layer 83 are preferably at least partially line-symmetric with each other about the extending direction of the insulating layer 81 extending in one direction in the cross section. As is apparent from comparison among FIG. 4A, FIG. 4B, and FIG. 4C, as the symmetry between the shape of the inner end portion 85-1 of the metal layer 85 and the shape of the inner end portion 83-1 of the circuit layer 83 in the cross section increases, the bias of the electric field strength in the insulating layer 81 is reduced.

In addition, in the cross section of the laminated substrate 71 in the laminating direction, it is preferable that the thickness of at least one end portion of the inner end portion 85-1 of the metal layer 85 adjacent to the relaxation portion 88 and the inner end portion 83-1 of the circuit layer 83 adjacent to the slit 84 of the circuit layer 83 is gradually reduced from one side adjacent to the insulating layer 81 toward the other side, and the other side of the at least one end portion has a shape protruding toward the relaxation portion 88 or the slit 84. That is, the shape of the inner end portion 85-1 of the metal layer 85 and the shape of the inner end portion 83-1 of the circuit layer 83 in the cross section are preferably obtuse angles. Note that, further in other words, the cross-sectional width of each of the slit 84 and the relaxation portion 88 in the cross section preferably is gradually reduced toward each direction away from the insulating layer 81.

As is apparent from comparison among FIG. 4A, FIG. 4B, and FIG. 4C, in FIG. 4C in which these shapes are all obtuse angles, wraparound of the equipotential lines to the surface side of the circuit layer 83 on which the semiconductor chip 78 is mounted is gentle as compared with FIG. 4A in which only the shape of the inner end portion 83-1 of the circuit layer 83 is acute angles. Therefore, in the shape of the inner end portion 85-1 of the metal layer 85 and the shape of the inner end portion 83-1 of the circuit layer 83 in the cross section, the bias of the electric field strength in the insulating layer 81 is further reduced as the acute angle becomes the obtuse angle.

Note that, in FIG. 4A and the like, the inner end portion 85-1 of the metal layer 85 has an obtuse angle in any example, but the inner end portion 85-1 of the metal layer 85 may have any of an acute angle, a right angle, and an obtuse angle as in the example of the circuit layer 83 in FIG. 4A and the like. In addition, the shape of the inner end portion 85-1 of the metal layer 85 and the shape of the inner end portion 83-1 of the circuit layer 83 may be arbitrarily combined.

Figure 5A:
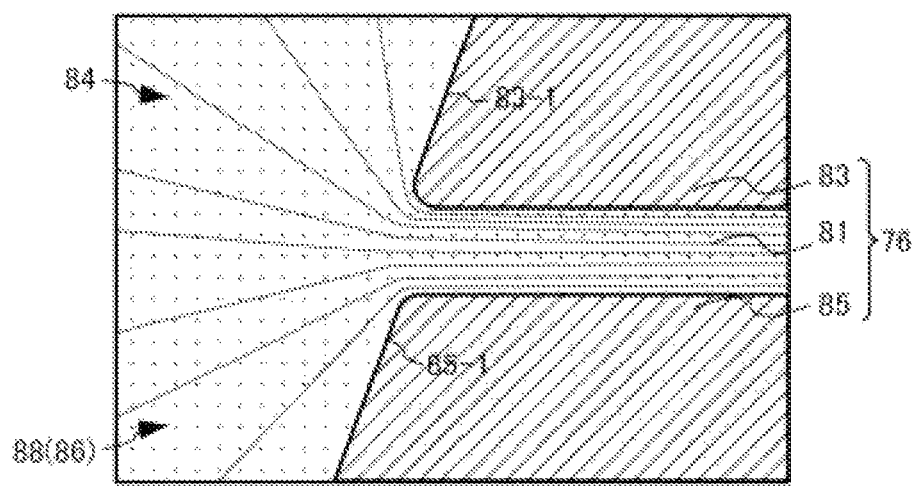
FIG. 5A is an explanatory diagram of another modification of the region [A] indicated by the broken line in FIG. 1.
Figure 5B:
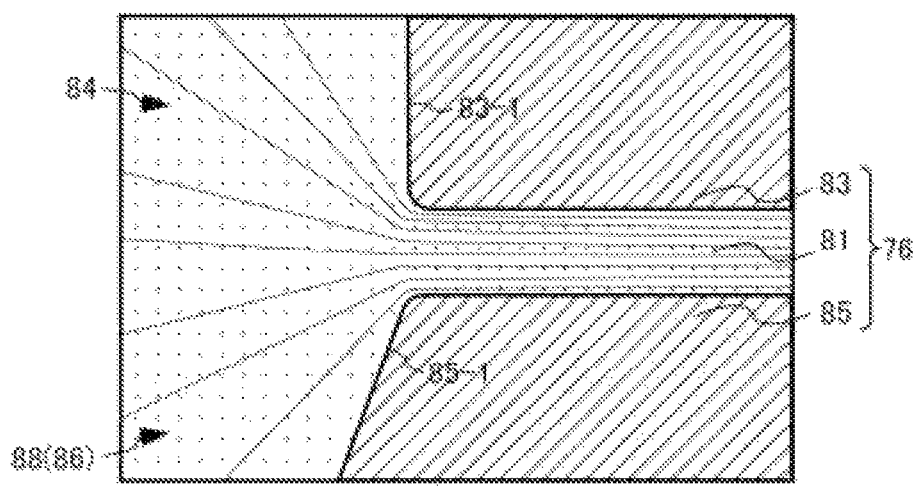
FIG. 5B is an explanatory diagram of another modification of the region [A] indicated by the broken line in FIG. 1.
Figure 5C:
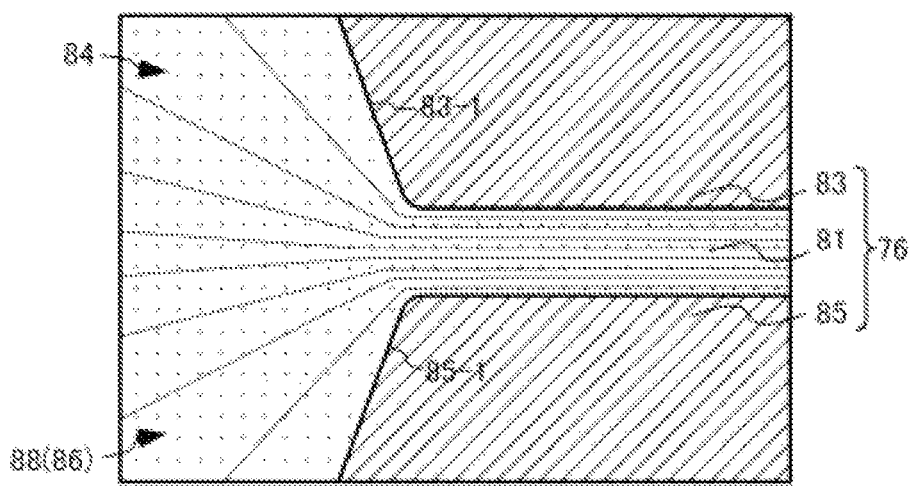
FIG. 5C is an explanatory diagram of another modification of the region [A] indicated by the broken line in FIG. 1.

FIG. 5A, FIG. 5B, and FIG. 5C are explanatory diagrams of other modifications of the region [A] indicated by a broken line in FIG. 1. Each of FIG. 5A, FIG. 5B, and FIG.

5C illustrate modifications in which the corner of the inner end portion 85-1 of the metal layer 85 and the corner of the inner end portion 83-1 of the circuit layer 83 are R-chamfered in each of FIG. 4A, FIG. 4B, and FIG. 4C. As illustrated in FIG. 5A and the like, in the cross section of the laminated substrate 71 in the laminating direction, the corner of the inner end portion 85-1 of the metal layer 85 adjacent to the relaxation portion 88 and the corner of the inner end portion 83-1 of the circuit layer 83 adjacent to the slit 84 of the circuit layer 83 are preferably chamfered. In a case where these corners are chamfered, the wraparound of the equipotential lines to the surface side of the circuit layer 83 on which the semiconductor chip 78 is mounted and the bottom side of the recess 86 of the metal layer 85 is gentle as compared with the case where these corners are not chamfered. Therefore, as the corner of the inner end portion 85-1 of the metal layer 85 and the corner of the inner end portion 83-1 of the circuit layer 83 in the cross section change from the angular shape to the rounded shape, the bias of the electric field strength in the insulating layer 81 is further reduced.

Figure 6A:
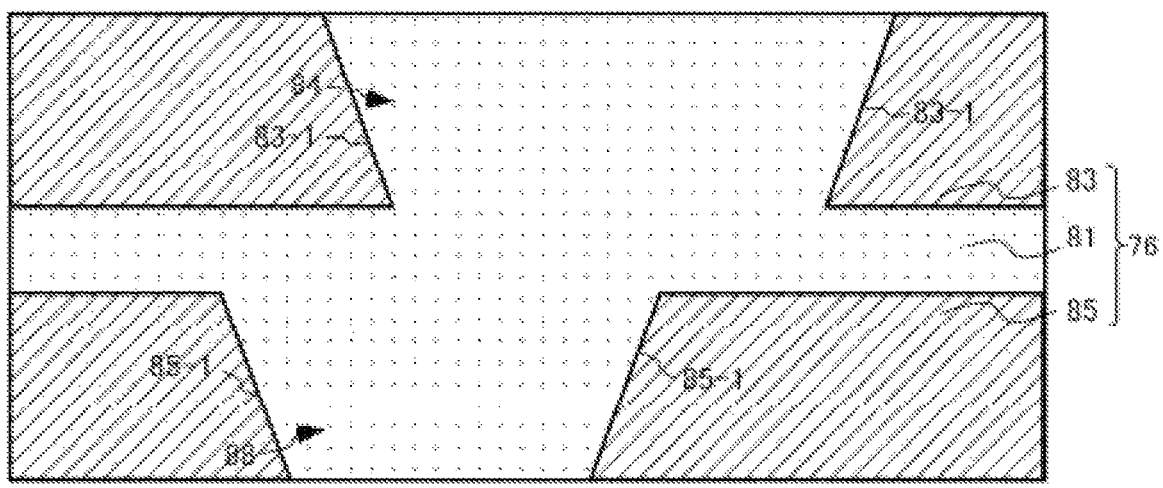
FIG. 6A is an explanatory diagram of a modification regarding a region [B] indicated by a broken line in FIG. 1.
Figure 6B:
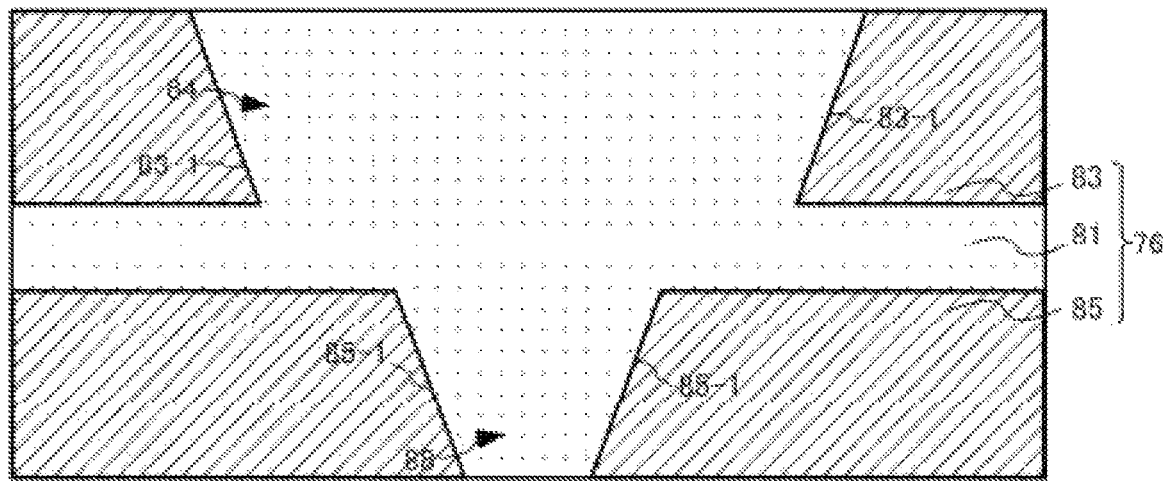
FIG. 6B is an explanatory diagram of a modification regarding the region [B] indicated by the broken line in FIG. 1.
Figure 6C:
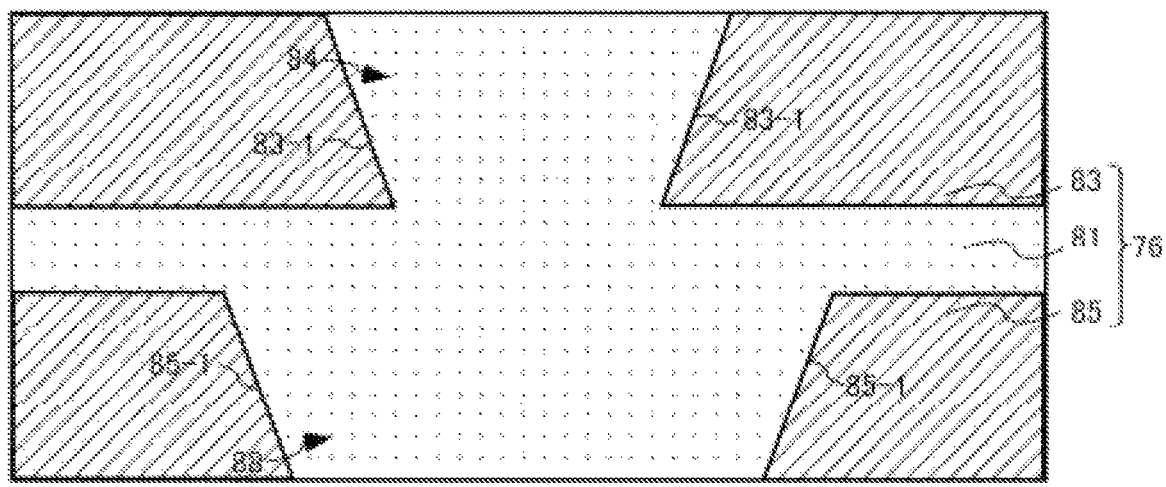
FIG. 6C is an explanatory diagram of a modification regarding the region [B] indicated by the broken line in FIG. 1.

FIG. 6A, FIG. 6B, and FIG. 6C are explanatory diagrams of a modification regarding a region [B] indicated by a broken line in FIG. 1. FIG. 6A illustrates a modification in which the slit 84 of the circuit layer 83 and the relaxation portion 88 of the metal layer 85 are nested with each other in the cross section of the laminated substrate 71 in the laminating direction. In addition, FIG. 6B illustrates a modification in which the width of the slit 84 of the circuit layer 83 is larger than the width of the relaxation portion 88 of the metal layer 85 in the cross section. In addition, FIG. 6C illustrates a modification in which the width of the slit 84 of the circuit layer 83 is smaller than the width of the relaxation portion 88 of the metal layer 85 in the cross section. As illustrated in FIG. 6A and the like, the slit 84 and the relaxation portion 88 may be shifted from each other or may be in a magnitude relationship with each other in a planar view. As a preferred example, the shift width between the slit 84 and the relaxation portion 88 in a planar view is 20% or less in a case where the thickness of the insulating layer 81 is 100%.

Figure 7A:
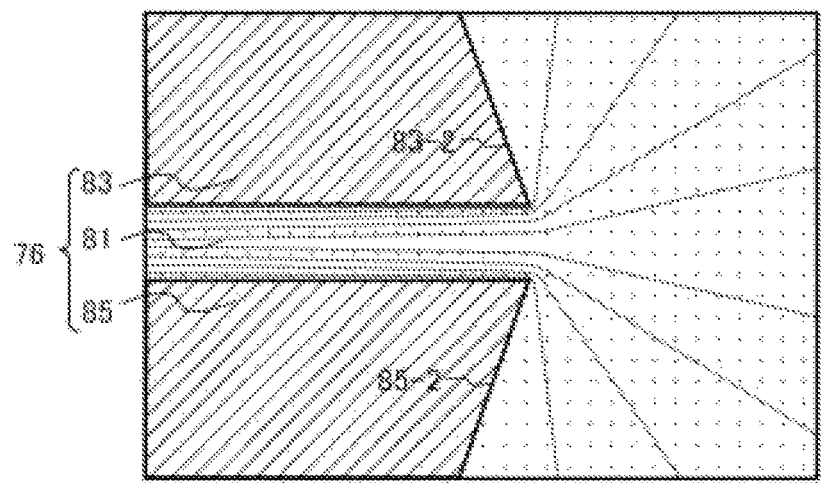
FIG. 7A is an explanatory diagram of an example regarding a region [C] indicated by a broken line in FIG. 1.
Figure 7B:
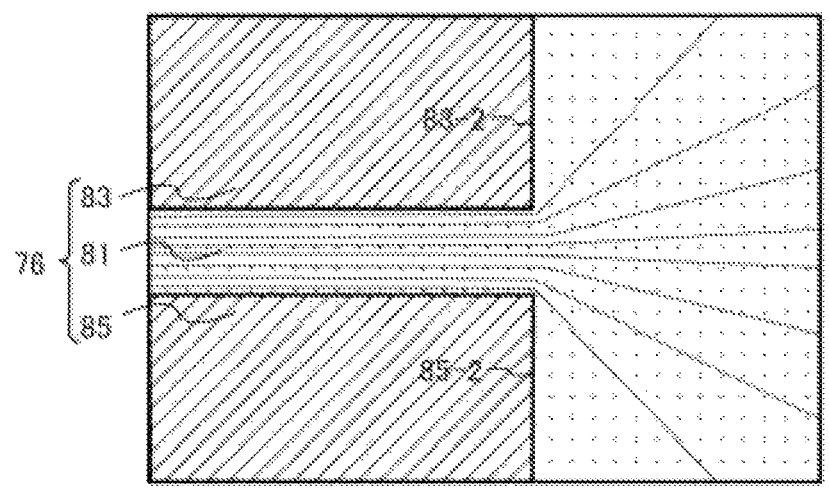
FIG. 7B is an explanatory diagram of a modification regarding the region [C] indicated by the broken line in FIG. 1.
Figure 7C:
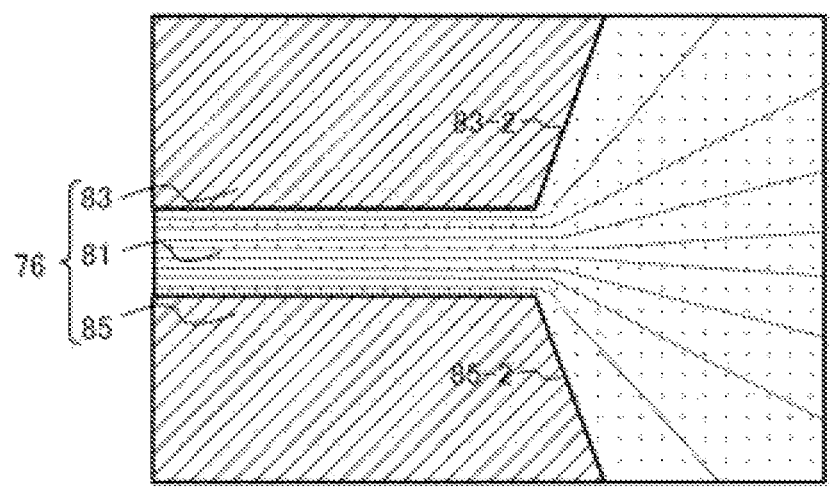
FIG. 7C is an explanatory diagram of a modification regarding the region [C] indicated by the broken line in FIG. 1.

FIG. 7A, FIG. 7B, and FIG. 7C are explanatory diagrams of an example and modifications regarding a region [C] indicated by a broken line in FIG. 1. FIG. 7A illustrates a configuration in the embodiment of FIG. 1, and FIG. 7B and FIG. 7C illustrate modifications of the configuration in the embodiment of FIG. 1.

As illustrated in each example of FIG. 7A, FIG. 7B, and FIG. 7C, for the same reason as described with reference to FIG. 4A and the like, in the cross section of the laminated substrate 71 in the laminating direction, the shape of the outer end portion 85-2 in the outer peripheral portion of the metal layer 85 and the shape of the outer end portion 85-2 in the outer peripheral portion of the circuit layer 83 are preferably at least partially line-symmetric with each other about the extending direction of the insulating layer 81 extending in one direction in the cross section.

In addition, for the same reason as described with reference to FIG. 4A and the like, in the cross section of the laminated substrate 71 in the laminating direction, it is preferable that the thickness of at least one end portion of the outer end portion 85-2 in the outer peripheral portion of the metal layer 85 and the outer end portion 83-2 in the outer peripheral portion of the circuit layer 83 is gradually reduced from one side adjacent to the insulating layer 81 toward the other side, and the other side of the at least one end portion has a shape protruding toward the outside of the metal layer 85 or the circuit layer 83.

As described above, the semiconductor module 70 of any of the modifications illustrated in FIG. 4B, FIG. 4C, FIG. 5A, FIG. 5B, FIG. 5C, FIG. 6A, FIG. 6B, FIG. 6C, FIG. 7B, and FIG. 7C has the same effect as the effect of the semiconductor module 70 according to the embodiment illustrated in FIG. 1.

Figure 8:
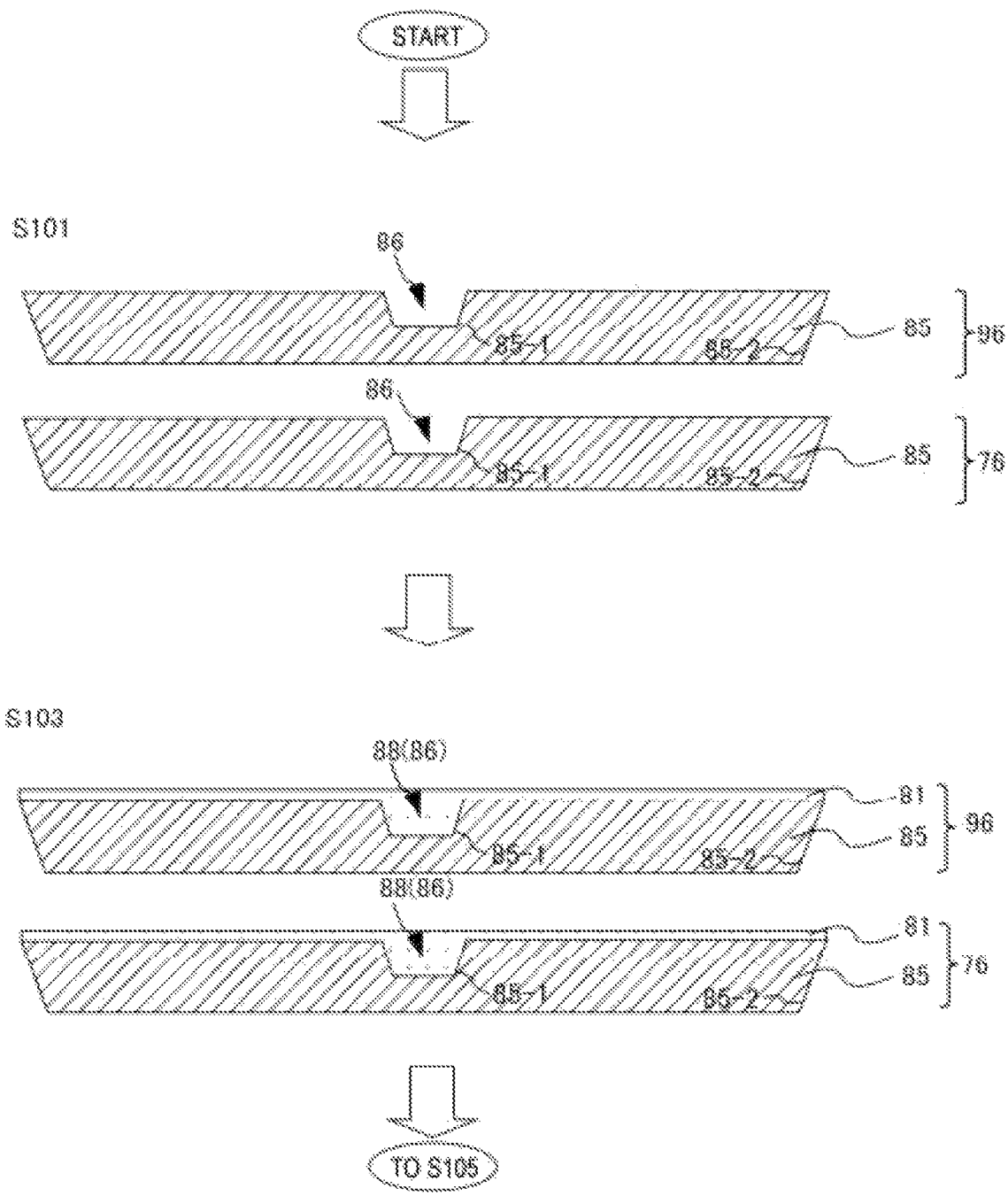
FIG. 8 is a flowchart illustrating an example of a manufacturing method of the semiconductor device 100 according to one embodiment of the present invention.
Figure 9:
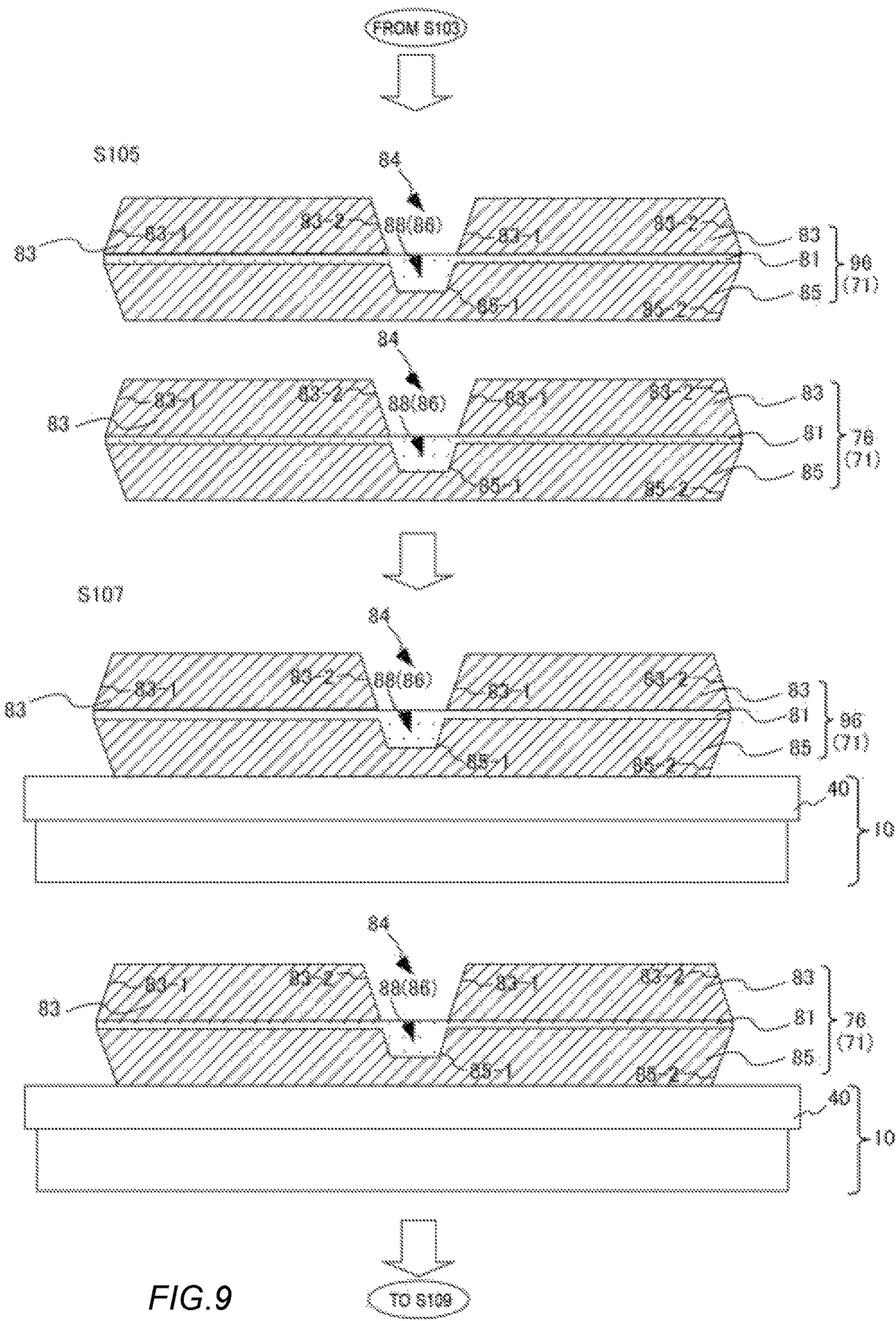
FIG. 9 is a flowchart illustrating an example of a manufacturing method of the semiconductor device 100 according to one embodiment of the present invention.
Figure 10:
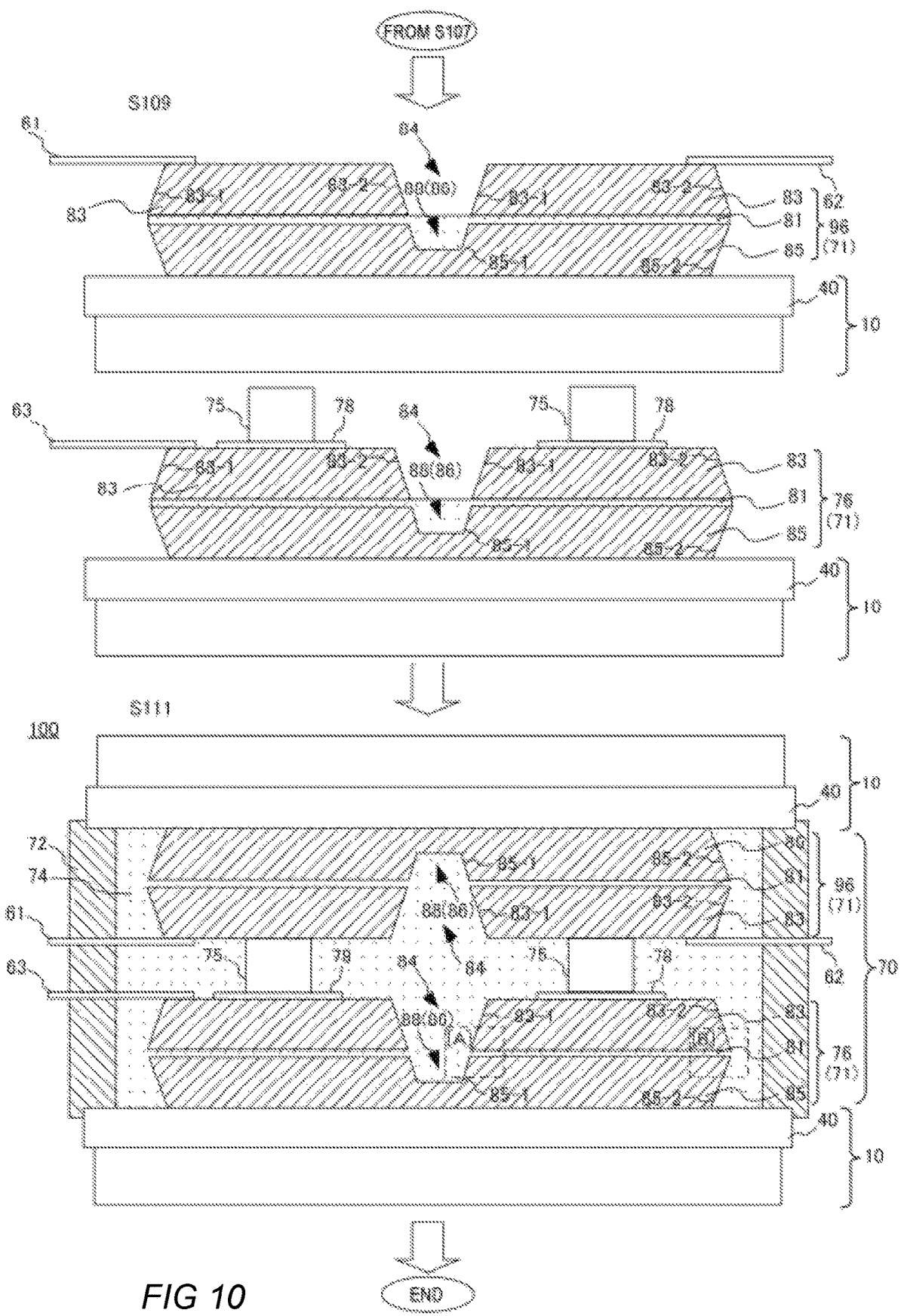
FIG. 10 is a flowchart illustrating an example of a manufacturing method of the semiconductor device 100 according to one embodiment of the present invention.

FIG. 8 to FIG. 10 are flowcharts illustrating an example of a manufacturing method of the semiconductor device 100 according to one embodiment of the present invention. This flow also shows an example of a manufacturing method of the semiconductor module 70.

When the flow is started, as illustrated in FIG. 8, the metal layer 85 is formed for each of the circuit board 76 and the wiring board 96, and the recess 86 recessed from the upper surface side toward the lower surface side of the metal layer 85 is formed (Step S101).

For each of the circuit board 76 and the wiring board 96, a layer of a resin material is provided on the upper surface side of the metal layer 85, whereby the insulating layer 81 is formed, and the relaxation portion 88 integrated with the insulating layer 81 is provided in the recess 86 of the metal layer 85 (Step S103). Note that, as illustrated in FIG. 8, the relaxation portion 88 integrated with the insulating layer 81 is integrally connected to each other by being formed of a resin material at once.

As illustrated in FIG. 9, the circuit layer 83 is formed in the upper surface of the insulating layer 81, and the slit 84 is formed in the circuit layer 83 (Step S105). The metal layer 85 of the circuit board 76 and the metal layer 85 of the wiring board 96 thus formed each are bonded to the base plate 40 of the cooling device 10 (Step S107).

As illustrated in FIG. 10, the semiconductor chip 78 is provided in the upper surface of the circuit layer 83 of the circuit board 76, and wire bonding wirings and terminal, that is, the output terminal 63, are attached to the upper surface of the circuit layer 83 on which the semiconductor chip 78 is provided (Step S109). In Step S109, the wire bonding wiring and the input terminals 61 and 62 are similarly attached also to the wiring board 96.

The housing portion 72 having an internal space for accommodating the semiconductor chip 78, the circuit board 76, and the wiring board 96 is attached to the upper surface of the base plate 40 of the cooling device 10, and the internal space of the housing portion 72 is filled with a resin material and cured to form the sealing portion 74 that at least partially seals the semiconductor chip 78, the circuit board 76, and the wiring board 96 (Step S111), whereby the semiconductor device 100 is manufactured, and the flow ends.

Figure 11:
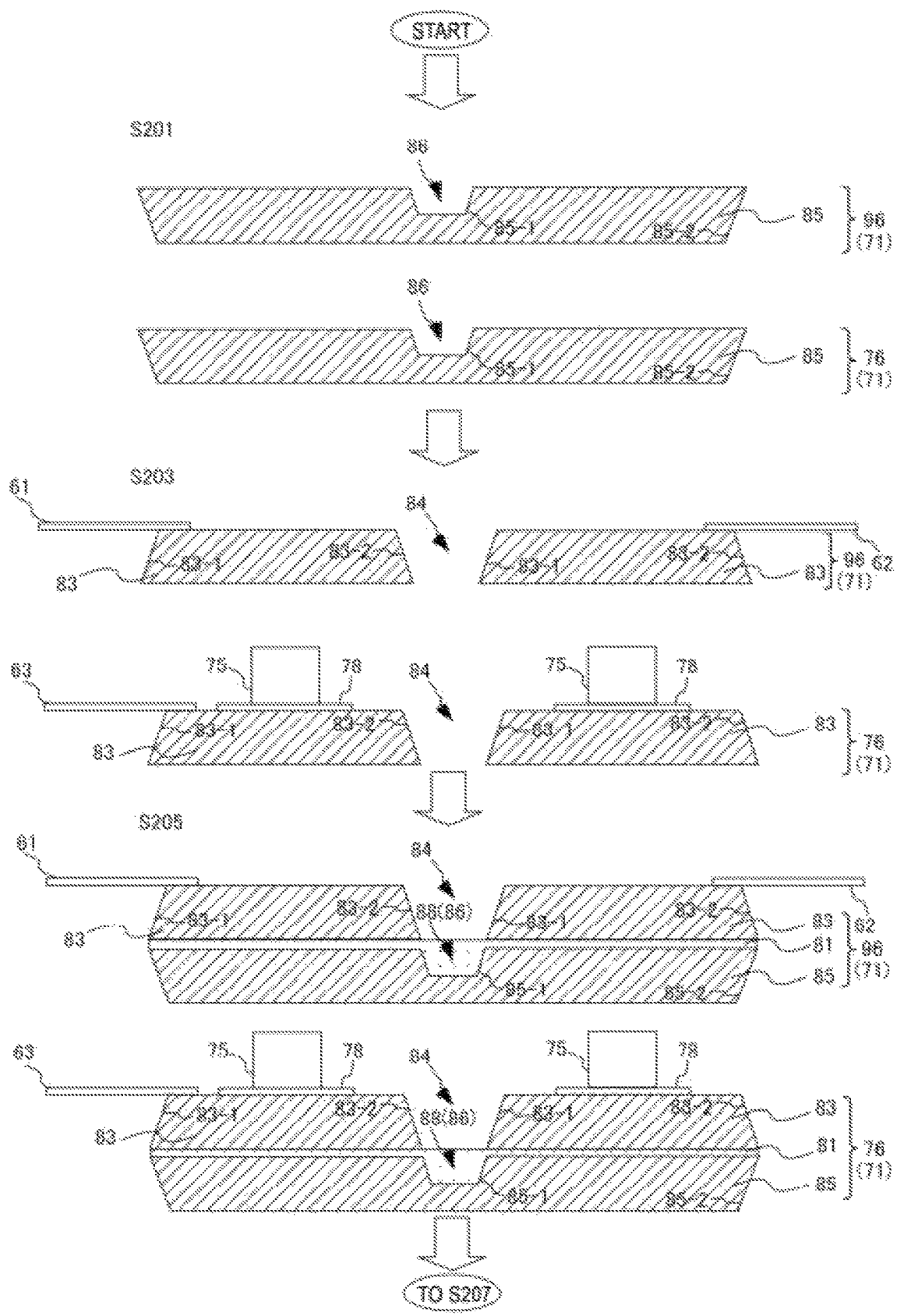
FIG. 11 is a flowchart illustrating another example of the manufacturing method of the semiconductor device 100 according to one embodiment of the present invention.
Figure 12:
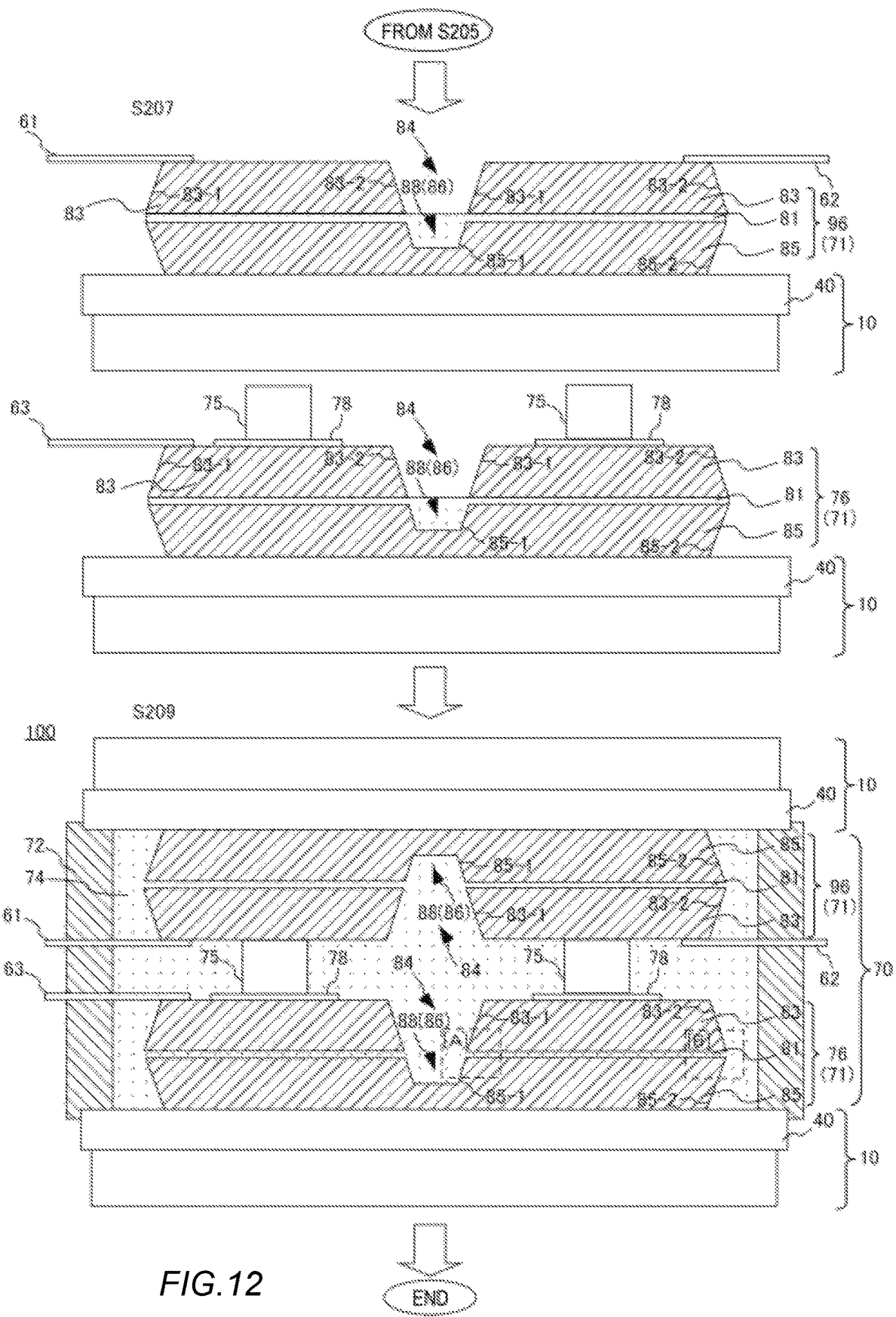
FIG. 12 is a flowchart illustrating another example of the manufacturing method of the semiconductor device 100 according to one embodiment of the present invention.

FIG. 11 and FIG. 12 are flowcharts illustrating another example of the manufacturing method of the semiconductor device 100 according to one embodiment of the present invention. This flow also shows an example of a manufacturing method of the semiconductor module 70.

When the flow is started, as illustrated in FIG. 11, the metal layer 85 is formed for each of the circuit board 76 and the wiring board 96, and the recess 86 recessed from the upper surface side toward the lower surface side of the metal layer 85 is formed (Step S201). The circuit layer 83 is formed, the slit 84 is formed in the circuit layer 83, the semiconductor chip 78 is provided in the upper surface of the circuit layer 83 of the circuit board 76, and wire bonding wirings and terminal, that is, the output terminal 63, are attached to the upper surface of the circuit layer 83 on which the semiconductor chip 78 is provided (Step S203). In Step S203, the wire bonding wirings and the input terminals 61 and 62 are similarly attached also to the wiring board 96.

The insulating layer 81 is formed by disposing it with a gap between the upper surface of the metal layer 85 and the lower surface of the circuit layer 83, and filling the gap with a resin material to cure the resin material, and the relaxation portion 88 integrated with the insulating layer 81 is provided in the recess 86 of the metal layer 85 (Step S205).

As illustrated in FIG. 12, the metal layer 85 of the circuit board 76 and the metal layer 85 of the wiring board 96 formed in Step S205 are bonded to the base plate 40 of the cooling device 10 (Step S207).

The housing portion 72 having an internal space for accommodating the semiconductor chip 78, the circuit board 76, and the wiring board 96 is attached to the upper surface of the base plate 40 of the cooling device 10, and the internal space of the housing portion 72 is filled with a resin material and cured to form the sealing portion 74 that at least partially seals the semiconductor chip 78, the circuit board 76, and the wiring board 96 (Step S111), whereby the semiconductor device 100 is manufactured, and the flow ends.

Figure 13:
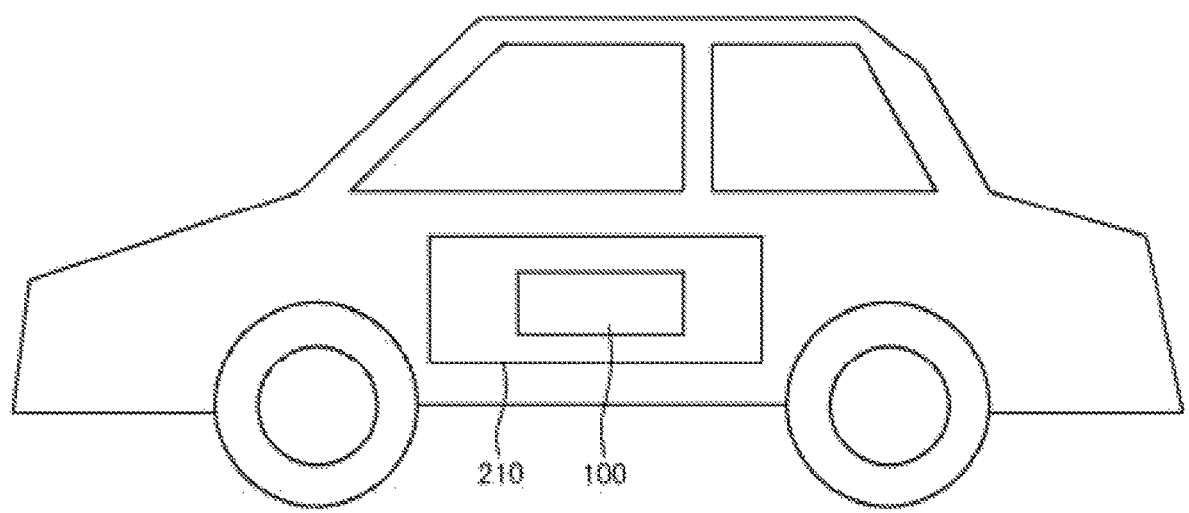
FIG. 13 is a diagram illustrating an outline of a vehicle 200 according to one embodiment of the present invention.

FIG. 13 is a diagram illustrating an outline of a vehicle 200 according to one embodiment of the present invention. The vehicle 200 is a vehicle that generates at least some propulsion power using electric power. As an example, the vehicle 200 is an electric vehicle that generates all propulsion power by an electric power drive device such as a motor, or a hybrid vehicle that uses both an electric power drive device such as a motor and an internal combustion engine driven by fuel such as gasoline.

The vehicle 200 includes a control device 210 (external device) that controls an electric power drive mechanism such as a motor. The control device 210 is provided with the semiconductor device 100. The semiconductor device 100 may control power to be supplied to the power drive mechanism.

Figure 14:
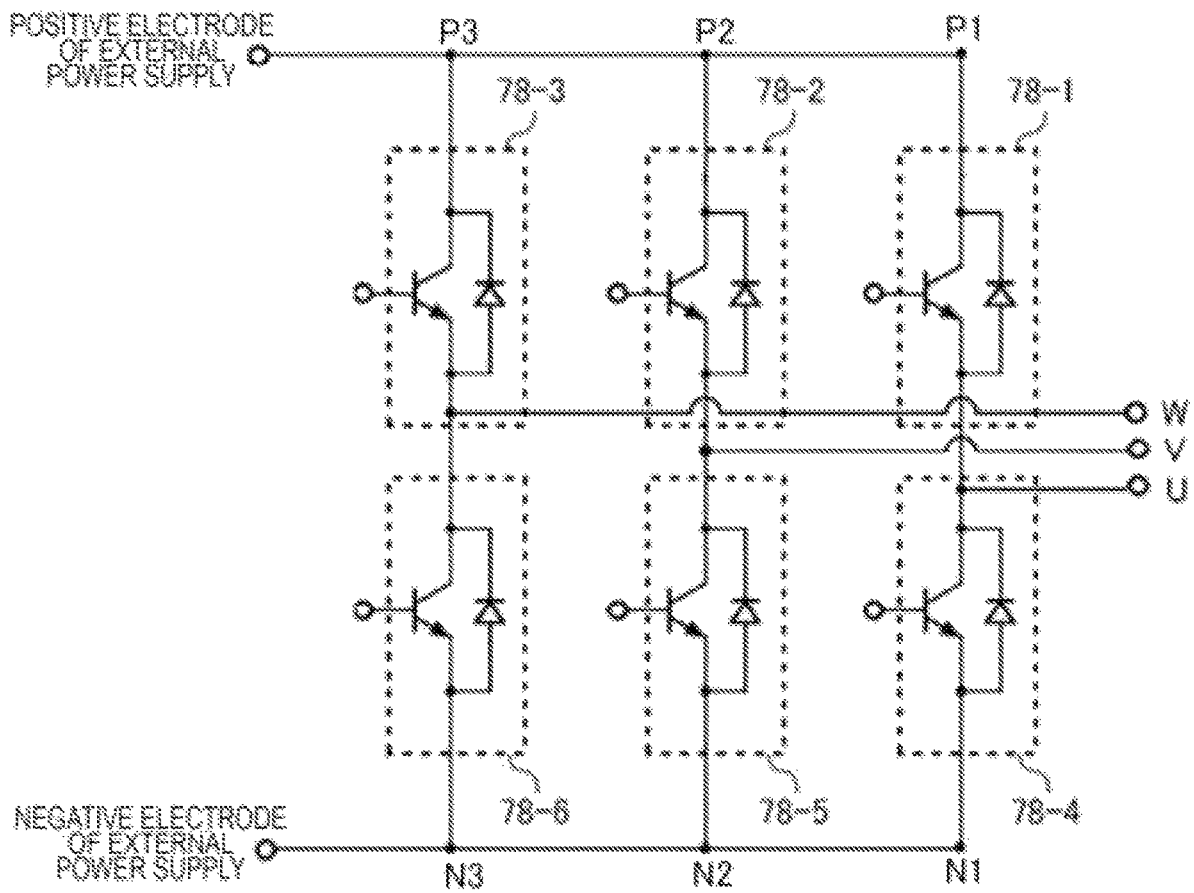
FIG. 14 is a main circuit diagram of the semiconductor device 100 according to one embodiment of the present invention.

FIG. 14 is a main circuit diagram of the semiconductor device 100 according to a plurality of embodiments of the present invention. The semiconductor device 100 functions as a three-phase AC inverter circuit having output terminals U, V, and W, and may be a part of an in-vehicle unit that drives a motor of a vehicle.

In the semiconductor device 100, semiconductor chips 78-1, 78-2, and 78-3 may constitute an upper arm, and semiconductor chips 78-4, 78-5, and 78-6 may constitute a lower arm. The set of semiconductor chips 78-1 and 78-4 may constitute a leg (U phase). The set of semiconductor chips 78-2 and 78-5 and the set of semiconductor chips 78-3 and 78-6 may similarly constitute legs (V-phase, W-phase). In the semiconductor chip 78-4, the emitter electrode may be electrically connected to an input terminal N1, and the collector electrode may be electrically connected to the output terminal U. In the semiconductor chip 78-1, the emitter electrode may be electrically connected to the output terminal U, and the collector electrode may be electrically connected to an input terminal P1. Similarly, in the semiconductor chips 78-5 and 78-6, the emitter electrode may be electrically connected to input terminals N2 and N3, respectively, and the collector electrode may be electrically connected to the output terminals V and W, respectively. Further, in the semiconductor chips 78-2 and 78-3, the emitter electrode may be electrically connected to the output terminals V and W, respectively, and the collector electrode may be electrically connected to the input terminals P2 and P3, respectively.

Each of the semiconductor chips 78-1 to 78-6 may be alternately switched by a signal input to a corresponding control terminal. In the present embodiment, each semiconductor chip 78 may generate heat during switching. The input terminals P1, P2, and P3 may be connected to the positive electrode of the external power supply, the input terminals N1, N2, and N3 may be connected to the negative electrode of the external power supply, and the output terminals U, V, and W may be connected to the load, respectively. The input terminals P1, P2, and P3 may be electrically connected to each other, and the other input terminals N1, N2, and N3 may also be electrically connected to each other.

In the semiconductor device 100, each of the plurality of semiconductor chips 78-1 to 78-6 may be an RC-IGBT (reverse conducting IGBT) semiconductor chip. In addition, each of the semiconductor chips 78-1 to 78-6 may include a combination of a transistor such as a MOSFET or an IGBT and a diode.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: cooling device
40: base plate
61, 62: input terminal
63: output terminal
70: semiconductor module
71: laminated substrate
72: housing portion
74: sealing portion
75: conductive post
76: circuit board
78, 78-1, 78-2, 78-3, 78-4, 78-5, 78-6: semiconductor chip
81: insulating layer
83: circuit layer
83-1: inner end portion
83-2: outer end portion
84: slit
85: metal layer
85-1: inner end portion
85-2: outer end portion
86: recess
88: relaxation portion
96: wiring board
100: semiconductor device
200: vehicle
210: control device

What is claimed is:

1. A semiconductor module comprising a laminated substrate in which a circuit layer, an insulating layer, and a metal layer are sequentially laminated, wherein
   a slit is formed in the circuit layer,
   a recess is formed in the metal layer, wherein the recess is recessed from one surface of the metal layer facing the insulating layer toward an other surface of the metal layer, and the recess has a bottom end that does not reach the other surface of the metal layer, and
   the recess of the metal layer has a relaxation portion at least partially overlapping the slit of the circuit layer in a planar view, the relaxation portion relaxing an electric field strength in at least a portion of the insulating layer.

2. The semiconductor module according to claim 1, wherein
   the relaxation portion is integrally formed with the insulating layer.

3. The semiconductor module according to claim 2, wherein
   the relaxation portion is integrally formed with the insulating layer by a resin material.

4. The semiconductor module according to claim 3, further comprising a sealing portion configured to at least partially seal the laminated substrate, wherein
   the relaxation portion is integrally formed with the sealing portion and the insulating layer by the resin material.

5. The semiconductor module according to claim 3, wherein
   a thickness of the insulating layer formed of the resin material is 0.1 mm or less.

6. The semiconductor module according to claim 4, wherein
   a thickness of the insulating layer formed of the resin material is 0.1 mm or less.

7. The semiconductor module according to claim 1, further comprising a sealing portion configured to at least partially seal the laminated substrate, wherein
   the insulating layer is a plate material formed of a ceramic material.

8. The semiconductor module according to claim 1, wherein
   in a cross section of the laminated substrate in a laminating direction, a shape of an inner end portion of the metal layer adjacent to the relaxation portion and a shape of an inner end portion of the circuit layer forming the slit of the circuit layer have a portion being line-symmetric with each other with respect to the insulating layer about an extending direction of the insulating layer extending in one direction in the cross section.

9. The semiconductor module according to claim 2, wherein
   in a cross section of the laminated substrate in a laminating direction, a shape of an inner end portion of the metal layer adjacent to the relaxation portion and a shape of an inner end portion of the circuit layer forming the slit of the circuit layer have a portion being line-symmetric with each other with respect to the insulating layer about an extending direction of the insulating layer extending in one direction in the cross section.

10. The semiconductor module according to claim 3, wherein
    in a cross section of the laminated substrate in a laminating direction, a shape of an inner end portion of the metal layer adjacent to the relaxation portion and a shape of an inner end portion of the circuit layer forming the slit of the circuit layer have a portion being line-symmetric with each other with respect to the insulating layer about an extending direction of the insulating layer extending in one direction in the cross section.

11. The semiconductor module according to claim 4, wherein
    in a cross section of the laminated substrate in a laminating direction, a shape of an inner end portion of the metal layer adjacent to the relaxation portion and a shape of an inner end portion of the circuit layer forming the slit of the circuit layer have a portion being line-symmetric with each other with respect to the insulating layer about an extending direction of the insulating layer extending in one direction in the cross section.

12. The semiconductor module according to claim 5, wherein
    in a cross section of the laminated substrate in a laminating direction, a shape of an inner end portion of the metal layer adjacent to the relaxation portion and a shape of an inner end portion of the circuit layer forming the slit of the circuit layer have a portion being line-symmetric with each other with respect to the insulating layer about an extending direction of the insulating layer extending in one direction in the cross section.

13. The semiconductor module according to claim 1, wherein
    in a cross section of the laminated substrate in a laminating direction, a shape of an outer end portion in an outer peripheral portion of the metal layer and a shape of an outer end portion in an outer peripheral portion of the circuit layer have a portion being line-symmetric with each other with respect to the insulating layer about an extending direction of the insulating layer extending in one direction in the cross section.

14. The semiconductor module according to claim 1, wherein
    in a cross section of the laminated substrate in a laminating direction, a thickness of at least one end portion of an inner end portion of the metal layer adjacent to the relaxation portion and an inner end portion of the circuit layer forming the slit of the circuit layer is gradually reduced from one side adjacent to the insulating layer toward an other side, and the other side of the at least one end portion has a shape protruding so that a width of at least one of the relaxation portion or the slit corresponding to the at least one end portion is reduced.

15. The semiconductor module according to claim 1, wherein
    in a cross section of the laminated substrate in a laminating direction, a thickness of at least one end portion of an outer end portion in an outer peripheral portion of the metal layer and an outer end portion in an outer peripheral portion of the circuit layer is gradually reduced from one side adjacent to the insulating layer toward an other side, and the other side of the at least one end portion has a shape protruding toward an outside of at least one of the metal layer or the circuit layer corresponding to the at least one end portion.

16. The semiconductor module according to claim 1, further comprising:
- a second laminated substrate in which a second circuit layer, a second insulating layer, and a second metal layer are sequentially laminated, wherein
- the laminated substrate is one of a circuit board or a wiring board facing the circuit board, and the second laminated substrate is another one of the circuit board or the wiring board, and
- the wiring board is electrically and thermally connected to the circuit board.

17. A semiconductor device comprising:
- a semiconductor module according to claim 1; and
- a cooling device thermally bonded to the metal layer of the laminated substrate in the semiconductor module.

18. A vehicle comprising:
- a control device provided with the semiconductor device according to claim 17.

* * * * *